United States Patent
Mears et al.

(10) Patent No.: US 6,993,222 B2
(45) Date of Patent: Jan. 31, 2006

(54) OPTICAL FILTER DEVICE WITH APERIODICALLY ARRANGED GRATING ELEMENTS

(75) Inventors: Robert J. Mears, Wellesley, MA (US); Michael Charles Parker, Colchester (GB)

(73) Assignee: RJ Mears, LLC, Waltham, MA (US)

( * ) Notice: Subject to any disclaimer, the term of this patent is extended or adjusted under 35 U.S.C. 154(b) by 157 days.

(21) Appl. No.: 10/683,888

(22) Filed: Oct. 10, 2003

(65) Prior Publication Data

US 2004/0208445 A1 Oct. 21, 2004

Related U.S. Application Data

(63) Continuation-in-part of application No. 09/914,944, filed as application No. PCT/GB00/00768 on Mar. 3, 2000.

(30) Foreign Application Priority Data

Mar. 3, 1999 (GB) .............................................. 9905196

(51) Int. Cl.
*G02B 6/34* (2006.01)

(52) U.S. Cl. .......................................... 385/37; 385/24

(58) Field of Classification Search .................. 385/10, 385/24, 37; 372/43, 45

See application file for complete search history.

(56) References Cited

U.S. PATENT DOCUMENTS

| 4,485,128 A | 11/1984 | Dalal et al. ..................... 427/85 |
| 4,882,609 A | 11/1989 | Schubert et al. ............... 357/22 |
| 4,908,678 A | 3/1990 | Yamazaki ....................... 357/4 |

(Continued)

FOREIGN PATENT DOCUMENTS

| EP | 0335176 A | 3/1989 |
| EP | 0712012 A | 11/1994 |
| EP | 0 843 361 | 5/1998 |
| JP | 61145820 A | 7/1986 |
| JP | 61220339 A | 9/1986 |
| WO | WO 93/14424 | 1/1993 |
| WO | WO 98/32187 | 1/1993 |
| WO | 99/63580 | 12/1999 |

OTHER PUBLICATIONS

Chang, C.P. et al.: "Optimization of a Thin–Film Multilayer Design bu Use of the Generalized Simulated–Annealing-method", Optics Letters, 15 No. 11, pp. 595–597 (Jun. 1, 1990).

Dobrowski, J.A.: "Computer Design of Optical Coatings", Thin Solid Films, 163, pp. 97–110 (1998).

Sarlett, G. et al.: "Optimization of Multiple Exposure Gratings for Widely Turnable Lasers", IEEE Photonics Technology Letters, 11, pp. 21–23 (1999).

Cohn, R.W. et al.: "Nanolithography Considerations for Multi–Passband Grating Filters", Optical Review 6, pp. 345–354 (1999).

DeChiaro, L.F.: "Spectral Width Reduction in Multilongitudinal Mode Lasers by Spatial Loss Profiling", J. Lightwave Technology 9, pp. 975–986 (Aug. 1991).

(Continued)

*Primary Examiner*—Phan T. H. Palmer
(74) *Attorney, Agent, or Firm*—Allen, Dyer, Doppelt, Milbrath & Gilchrist, P.A.

(57) ABSTRACT

A method for producing aperiodic gratings and waveguides with aperiodic gratings uses a simulated annealing process that starts with a random configuration of grating elements and iteratively computes a spectral response from a Fourier transform of the configuration of grating elements obtained in successive iterations. A cost function is computed as a convergence criterion. The aperiodic grating can be used, for example, as a filter in WDM applications.

22 Claims, 8 Drawing Sheets

U.S. PATENT DOCUMENTS

| | | | |
|---|---|---|---|
| 5,081,513 A | 1/1992 | Jackson et al. | 357/23.7 |
| 5,245,474 A | 9/1993 | Chabassier et al. | 359/578 |
| 5,388,173 A | 2/1995 | Glenn | 385/37 |
| 5,606,177 A | 2/1997 | Wallace et al. | 257/25 |
| 5,666,224 A | 9/1997 | Wood et al. | 359/573 |
| 5,742,433 A | 4/1998 | Shiono et al. | 359/575 |
| 5,867,304 A | 2/1999 | Galvanauskas et al. | 359/333 |
| 6,255,150 B1 | 7/2001 | Wilk et al. | 438/191 |
| 6,282,341 B1 * | 8/2001 | Digonnet et al. | 385/37 |
| 6,322,938 B1 | 11/2001 | Cohn | 430/8 |
| 6,326,311 B1 | 12/2001 | Ueda et al. | 438/694 |
| 6,350,993 B1 | 2/2002 | Chu et al. | 257/19 |
| 6,376,337 B1 | 4/2002 | Wang et al. | 438/478 |
| 6,436,784 B1 | 8/2002 | Allam | 438/380 |
| 6,501,092 B1 | 12/2002 | Nikonov et al. | 257/29 |
| 6,566,679 B2 | 5/2003 | Nikonov et al. | 257/29 |
| 6,621,097 B2 | 9/2003 | Nikonov et al. | 257/17 |
| 6,741,624 B2 * | 5/2004 | Mears et al. | 372/45 |
| 2003/0162335 A1 | 8/2003 | Yuki et al. | 438/151 |
| 2003/0215990 A1 | 11/2003 | Fitzgerald et al. | 438/172 |

OTHER PUBLICATIONS

Emi, D. et al.: "Evolutionary Optimization of Non–Periodic Coupled Cavity Semiconductor Laser Diodes", Optical and quantum Electronics 30, pp. 287–303 (1998).

Kozwolski, D.A. et al.: "Time–Domain Modeling of Mode Suppression in 1.3um Fabry–Perot Lasers", IEEE Photonics Technology Letters 8, pp. 755–757 (Jun. 1996).

Tsang, H.K. et al.: "Etched Cavity InGaAsP/InP Waveguide Fabry–Perot Filter Tunable by Current Injection", J. Lightwave Technology 17, pp. 1890–1895 (Oct. 1999).

Patent Abstracts of Japan, vol. 012, No. 080 (E–590), Mar. 12, 1988 & JP 62 219665 A (Fujitsu Ltd), Sep. 26, 1987 abstract.

Patent Abstracts of Japan, vol. 010, No. 179 (E–414), Jun. 24, 1986 & JP 61 027681 A (Res Dev Corp of Japan), Feb. 7, 1986 abstract.

* cited by examiner

OPTICAL FILTER DEVICE WITH APERIODICALLY ARRANGED GRATING ELEMENTS

CROSS-REFERENCE TO RELATED APPLICATIONS

This application is a continuation-in-part of U.S. patent application Ser. No. 09/914,944, filed Nov. 25, 2003, which is a national phase application of PCT/GB00/00768, filed Mar. 3, 2000, and claiming priority to British application 9905196.3, filed Mar. 3, 1999, the contents of which are incorporated herein by reference in their entirety.

FIELD OF THE INVENTION

The invention is directed to an optical aperiodic grating and filter structure producing multiple pass bands in either transmission or reflection. The grating/filter structure is designed by an efficient simulated annealing algorithm covering a large search space.

BACKGROUND OF THE INVENTION

Tunable multi-wavelength optical reflectors are important for a number of applications in optical telecommunications and signal processing including multiple channel optical telecommunications networks using wavelength division multiplexing (WDM). Such networks can provide advanced features, such as wavelength routing, wavelength switching and wavelength conversion, adding and dropping of channels and wavelength manipulation. Filters, such as comb filters and passband filters, are required to exclude spurious signals and to stabilize the different wavelengths. Generally such networks include optical amplifiers, such as Er-doped fiber amplifiers, with an overall bandwidth of approximately 35 nm across the ITU C-band and with a center-to-center spacing between adjacent wavelengths between 100 GHz for WDM and 25 GHz for dense WDM (DWDM).

Simple passband filters that reflect one particular wavelength are employed as cavity mirrors located at the front and rear end of the gain region in distributed Bragg reflector (DBR) lasers. These gratings tend to have a single grating period. A small degree of wavelength-tunability can be achieved by incorporating chirped gratings. However, the tuning range is in the order of 10 nm which is insufficient for optical WDM communication systems.

U.S. Pat. No. 5,325,392 discloses a grating with multiple sequentially arranged chirped regions and a wide tuning range in excess of 100 nm. The spacing between the reflectivity maxima is fixed and corresponds to the length of the repeating units. The laser can be tuned over the entire bandwidth of 45 nm by applying independently controlled currents (charge injection) to the distributed reflector region(s) and a built-in phase-adjustment region.

Conventional DBR laser grating designs typically employ deterministic gratings having a well-defined grating period which is smaller than the length of the grating, and other characteristic feature sizes, which limit their versatility. Conversely, aperiodic grating structures are defined as having repeating units with a length that exceeds the length of the grating. Aperiodic gratings have the advantage over periodic gratings that their spectral response can theoretically be selected to have any shape and form useful for the application. Several methods have been proposed to produce aperiodic grating structures, in particular for optical applications.

U.S. Pat. No. 6,141,370 discloses a grating including an array of gratings that are superimposed in an analog manner, and then subjected to a binary digitization. The process arranges grating segments of equal length and varies coefficients $a_j$ of a weighted sum of sinusoidal functions until a fit with the desired reflection peaks is obtained. The reference does not disclose how the process can be optimized.

U.S. Pat. No. 5,942,956 discloses a method for designing mode control and converter devices with an aperiodic grating. The aperiodic grating can have features of arbitrary size and arbitrary refractive index contrast. The disclosed method maximizes the power scattered into a specified mode at the output and the method is sufficiently efficient for the design of small numbers (typically tens) of high-contrast grating features. The method, however, becomes inefficient for gratings having a greater number of elements and lower contrast, as is the case for Group III–V semiconductor lasers where the refractive index contrast is typically $\Delta n \sim 8 \times 10^{-3}$ or less. A high-performance comb filter, for example, in InP may require 1,000 or more grating features which could make the scattering matrix approach difficult to manage.

U.S. Pat. No. 5,666,224 discloses a method for fabricating a non-periodic optical grating with a limited number of predefined grating lines and a limited number of predefined grating line features to keep the calculation of the matrix products of the scattering matrix manageable. The method is based on the calculation of a scattering matrix for each predefined grating line pattern or subsequence, with the scattering matrices for consecutive pairs then calculated by forming the product of the scattering matrices of the subsequences. The required pre-selection of the grating line patterns imposes limitations on the attainable spectral response of the grating.

It would therefore be desirable to develop a method for designing and producing an optical filter or grating structure that obviates the limitations of the prior art by providing grating structures with arbitrary feature sizes governed by their manufacturability, and with a predetermined spectral response, such as, for example, a comb filter with reflection maxima located at predetermined wavelengths and having predetermined relative amplitudes.

SUMMARY OF THE INVENTION

The described method according to the invention computes a spectral response of an arbitrarily selected initial grating structure (which can be subsequently refined based on experience) and matches the computed response to a predetermined spectral response. A predetermined spectral response is to be understood as a response where the intensity of individual spectral features, for example the reflectivity of individual reflection maxima of a grating, is selected to provide a desired or optimum response of a device, such as a DBR laser. The method uses a simulated-annealing algorithm to find an acceptable minimum solution after starting from a random seed.

According to one aspect of the invention, a method for creating an optical filter having aperiodically configured filter elements includes selecting initial characteristic attributes for the filter elements based upon a random seed, and generating an initial configuration of the filter elements having the characteristic attributes. A cost function is defined that represents a goodness of fit between a desired spectral response and a computed spectral response of the optical filter. The cost function is iteratively computed using a simulated annealing process by modifying at least one characteristic attribute of at least one filter element. If the iteratively computed cost function is less than a predetermined cost function, the configuration of the filter elements is selected as a desired configuration of the filter elements that corresponds to the iteratively computed cost function, thereby providing the desired spectral response.

According to another aspect of the invention, a method for producing an optical waveguide with a desired optical transmission characteristic includes defining a plurality of grating elements, wherein the grating elements represent an aperiodic grating, and selecting initial characteristic attributes for the grating elements based upon a random seed. An initial configuration of the grating elements having the characteristic attributes is generated, and a cost function representing a goodness of fit between a desired spectral response and a computed spectral response of the optical waveguide is defined. The cost function is iteratively computed using a simulated annealing process by modifying at least one characteristic attribute of at least one grating element. If the iteratively computed cost function is less than a predetermined cost function, the configuration of the grating elements that corresponds to the iteratively computed cost function is selected as a desired optimal configuration of the grating elements, thereby providing the desired spectral response. The aperiodic grating corresponding to the optimal configuration of the grating elements is then formed in or on the optical waveguide.

The aperiodic filter/grating can be designed to yield a specified comb of reflection peaks, with both the wavelength position and the relative amplitude of each peak being selectable. Embodiments of the invention may include one or more of the following features. The characteristic attribute may be a physical dimension of a grating/filter element, such as a physical dimension, which can include the width and/or height and/or index of refraction. The characteristic attribute may also be a spacing between the elements.

The simulated annealing process may include Fourier-transforming the characteristic attributes of the grating/filter elements. The grating/filter may have a fixed or variable length that can be changed by the iterative process. The total number of grating/filter elements can also be fixed or variable. The desired response can be selected to conform to the transmission peaks of the ITU grid or to compensate for a gain of a laser or amplifier.

Further features and advantages of the present invention will be apparent from the following description of preferred embodiments and from the claims.

BRIEF DESCRIPTION OF THE DRAWINGS

The following figures depict certain illustrative embodiments of the invention in which like reference numerals refer to like elements. These depicted embodiments are to be understood as illustrative of the invention and not as limiting in any way.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The method described herein is directed, inter alia, to an efficient algorithm for the design of aperiodic grating structures with a predetermined spectral response, such as a comb filter for applications as mirrors in optical waveguides and in DFB and DBR lasers. The structures described herein can be fabricated, for example, by electron-beam lithography and/or or photolithography using, for example, electron-beam-written masks.

Figure 1:
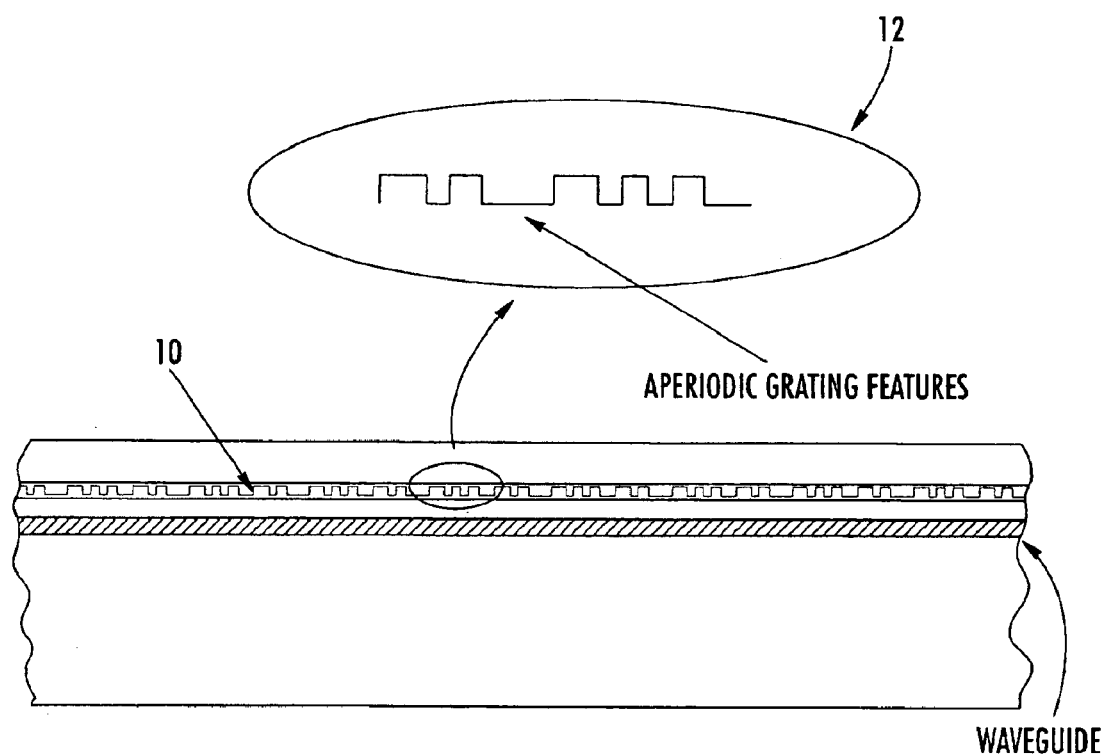
FIG. 1 shows schematically an aperiodic grating structure produced in accordance with the present invention.

FIG. 1 illustrates schematically a section of an exemplary aperiodic grating 10. The inset 12 illustrates in more detail a portion in which the lengths of the grating elements are permitted to vary continuously from a minimum practical feature size (approximately 50 nm for fabrication in state-of-the-art electron-beam lithography systems) up to, in principle, the length of the grating which in a DBR laser can be approximately 500 $\mu$m. The elements or features of the grating can be defined, for example, by their (effective) refractive index values, and can be binary (two refractive index values) to simplify the calculation or M-ary (more than two refractive index values). The width of the spectral maxima is determined by the attainable refractive index difference between the grating elements and the number of the grating elements. The upper length limit for the aperiodic grating structure typically can require in excess of 1000 grating elements ranging in length from the minimum 50 nm up to lengths on the order of 1 $\mu$m to 2 $\mu$m to match the complex predetermined optical response functions.

The aperiodic grating for a device can be designed by starting with a simulated grating having grating elements, i.e., the "contrast" elements, with initial positions along the waveguide defined by a predetermined distribution of elements or by a random distribution generated, for example, by a random seed value. Several constraints may be applied to the grating elements, such as a minimum manufacturable feature size, a desired maximum number of grating elements, etc. The grating lines represent a filter that has multiple transmission passbands of prescribed relative amplitude at the desired wavelengths and substantially stopbands over other wavelengths within the range of intended device operation on both sides of the desired lasing wavelength.

Figure 2:
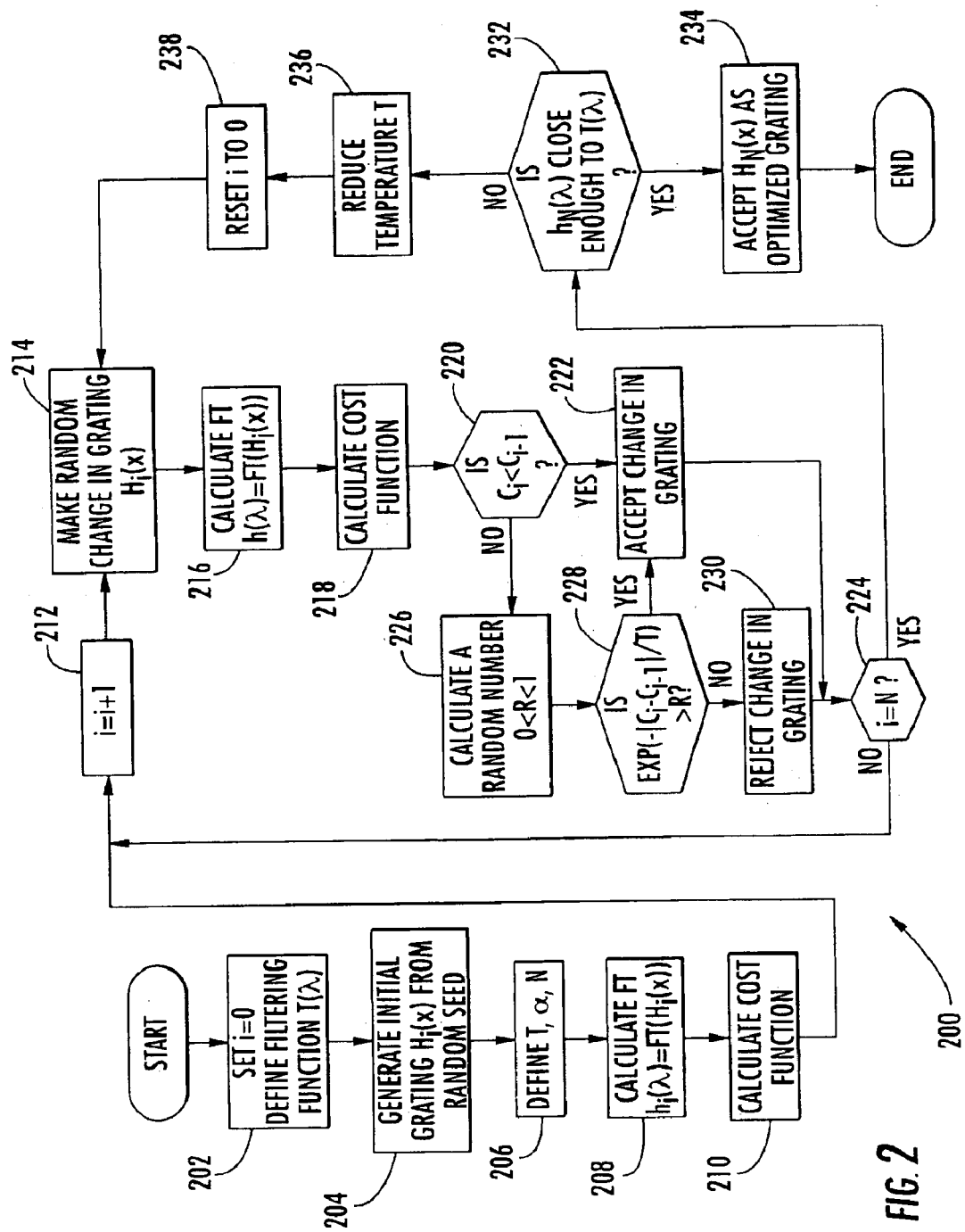
FIG. 2 is a flowchart of a process for computing an optimized aperiodic grating structure as shown in FIG. 1.

FIG. 2 is a flow diagram of an exemplary optimization algorithm for computing the grating elements of an aperiodic grating structure. This optimization algorithm uses a method referred to as simulated annealing and globally matches a computed spectral response to a desired spectral response. The calculations can be performed with a commercially available software program, such as MATLAB™, distributed by MathWorks Inc., of Natick, Mass.

Simulated annealing is a process which mimics actual annealing of a material by heat treatment. The material is hereby heated up and then slowly cooled down. Previously displaced atoms will then move into their respective equilibrium positions, and dislocations and defects will be largely eliminated.

In simulated annealing, a cost-function takes the place of the potential energy of an atom. The aim of the process is to locate a global minimum in cost space, by randomly "hopping" solutions around (a "hot" system) and then gradually "cooling" the system, thereby reducing the size of the random hops. If the cooling rate is chosen correctly, the solution will hop into the global minimum while the system is hot and be kept there as the system cools.

Referring back to FIG. 2, the optimization process 200 starts with step 202 by setting an index i=0 and defining a target filtering function $T(\lambda)$ which represents, for example, a predetermined or desired spectral output as a function of the wavelength $\lambda$ of the exemplary grating structure. A random seed value representing a possible grating structure within selected confines, such as refractive index step, manufacturable feature size, etc., is selected, generating an initial, typically aperiodic, real space grating structure $H_0(x)$, step 204, wherein x represents a coordinate along the length of the grating structure. An initial simulated annealing "temperature" $T_0$, a cooling rate $\lambda$ and a limit N for the number of iterations can also be assigned at this time, step 206. In step 208, the Fourier Transform (FT) of the initial real space grating structure $H_0(x)$ is calculated, giving an initial filtering function $h_0(\lambda)=FT[H_0(x)]$.

A cost function $C_0$ is calculated over the spectral range of interest, step 210. As can be seen, the cost function $C_0$ will decrease when the fit between the target filtering function and the calculated filtering function (FT of the real space grating structure) improves. To test if the cost function can be lowered, the index i is increased by 1, step 212, and a characteristic feature of a randomly selected element in the grating structure $H_0(x)$ is modified to produce a new grating, $H_1(x)$, step 214. The characteristic feature can be a refractive index of an element, a width and/or height of an element, and/or a spacing between elements or groups of elements. In step 216, the FT of the modified real space grating $H_i(x)$ is calculated, yielding a new filtering function $h_i(\lambda)=FT[H_i(x)]$. A new cost function $C_i$ is calculated, step 218, and compared with the cost function $C_{i-1}$ for the previous grating structure, i.e. initially with $C_0$ for the initial grating $H_0(x)$. If it is determined in step 220 that the new cost function $C_i$ is lower than the cost function $C_{i-1}$, then the new grating is accepted as an improved structure and used as a basis for subsequent iterations, step 222. If the maximum number of iterations N has not been reached, as determined in step 224, then the index i is incremented by 1, step 212, and the process returns to step 214.

Conversely, if it is determined in step 220 that the new cost function $C_i$ is $\geq C_{i-1}$, then a random number R between 0 and 1 is computed, step 226, and it is checked in step 228 if $\exp(-|C_i-C_{i-1}|/T)>R$, in which case the new grating is accepted and the process 200 returns to step 222. However, if the difference between $C_i$ and $C_{i-1}$ is such that $\exp(-|C_i-C_{i-1}|/T)\leq R$, then the new grating $H_i(x)$ is rejected and the element or feature previously changed in step 214 is returned to its previous state and the process returns to step 214 via the steps 224 and 212 described above.

If the limit N for the number of iterations has been reached, as determined in step 224, the process 200 checks in step 232 if the Fourier transform $h_N(\lambda)=FT[H_N(X)]$ of the grating $H_N(x)$ is sufficiently close to the target function $T(\lambda)$, for example, by computing the cost function $C_N$, and should therefore be accepted as an "optimized" structure, step 234. Those skilled in the art will, of course, appreciate that this "optimized" structure may be a locally, but not necessarily a globally optimized structure, which is mathematically difficult to obtain unless the entire search space is investigated.

If it is determined in step 232 that $h_N(\lambda)$ is not sufficiently close to the target function $T(\lambda)$, then the annealing temperature T is multiplied by a predetermined factor $\alpha<1$, i.e., the system is "cooled down", step 236, and the loop counter i is set again to zero, step 238. The process 200 then returns to step 214 for another random grating change.

The cooling rate $\alpha$ is typically kept constant throughout the annealing process. If $h_i(\lambda)$ does not change after executing additional loops, the process is stopped (not shown) as this may be a sign that the temperature is too low for further changes.

Constraints may be imposed on the grating feature parameters by practical limitations of the fabrication process which can be easily incorporated in the design model. For example, certain dimensions of the grating elements and spacing between the grating elements may be dictated by the feature sizes achievable with e-beam lithography, photolithography and/or focused ion beam milling. Additionally, the grating lines can also have different shapes, as long as these shapes can be adequately and efficiently modeled and manufactured, including but not limited to V-shaped features and cylindrical 'holes'.

One exemplary cost functions useful for the simulated annealing process is $C_n=\Sigma(T(\lambda_i)-h_i(\lambda_i))^2$, wherein the index n indicates the index of the iteration and the summation is performed, for example, over the wavelengths $\lambda_i$ of interest of the spectral response curve. As discussed below, the selected exponent of 2 is exemplary only and other exponents, such as 4, can be used instead to measure convergence of the process. The annealing process can be performed with a fixed overall length of the grating, whereby the number of grating elements is allowed to vary as long as a minimum defined feature size is maintained. Alternately or in addition, the length of the grating can vary. In the examples discussed below, the grating length was fixed.

Figure 6:
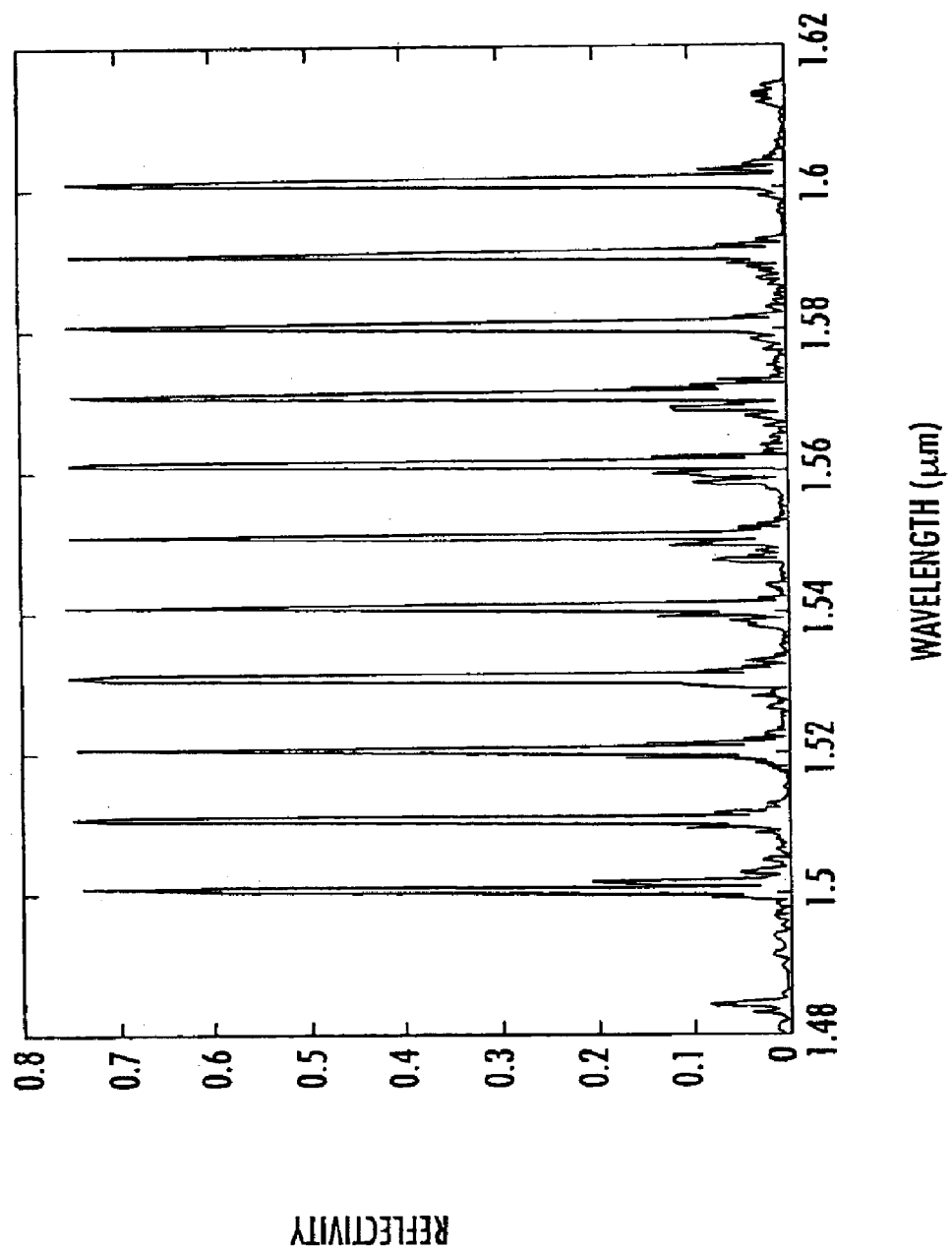
FIG. 6 shows schematically the spectral response of a comb filter designed with the process of FIG. 2 to have 11 spectral maxima of equal amplitude and equal wavelength spacing between 1.5 $\mu$m and 1.6 $\mu$m.

Referring now to FIG. 6, a binary aperiodic grating structure was computed with the method of FIG. 2, giving 11 response maxima between $\lambda=1.5$ and $\lambda=1.6$ $\mu$m of equal intensity and uniform wavelength spacing. The design was based on an effective refractive index contrast of $n_2-n_1=\Delta n=8\times 10^{-3}$, which is typical for grating elements formed in Group III–V compound semiconductors.

The initial grating structure used in the computation includes 10,000 grating elements each having length exactly equal to 50 nm and the refractive index of each element randomly assigned to be either $n_1=3.292292$ or $n_2=3.300$. It should be noted that the length of the grating can be selected to be fixed or can be changed during the computation to provide a better match to the predetermined spectral response. The following values were chosen for the annealing process: $T_{init}=1$; $\alpha=0.8$; $N_{max}=200,000$. It will be understood based on the discussion of the annealing process, that the iteration can be terminated either when a maximum number $N_{max}$ of iterations has been reached or when the computed cost function is less than a predetermined target cost function.

At each iteration, one grating element (between 1 to 10,000) is chosen at random and its index of refraction is "flipped" from $n_1=3.292292$ to $n_2=3.300$, or vice versa.

For the purpose of this comb filter design, an exponent of 4 is selected in the definition of the cost function:

$$C_N = \Sigma (TR(\lambda_i) - AR(\lambda_i))^4,$$

where $AR(\lambda_i)$ is the actual reflectivity and $TR(\lambda_i)$ is the target reflectivity at each wavelength $\lambda_i$.

The curve fit to the actual reflectivity is calculated by subtracting the actual reflectivity from the target reflectivity at each wavelength of interest, raising the difference to the fourth power, and summing the results over all target peaks to form the cost function. The target reflectivity is hereby defined by normalized amplitude-weighted delta functions at the wavelengths $\lambda_i$, leaving the target reflectivity undefined elsewhere. While this approach does not take into account the finite width of the reflectivity peaks, it nevertheless enables a fast computation of the spectral filter response with adequate accuracy.

Figure 3:
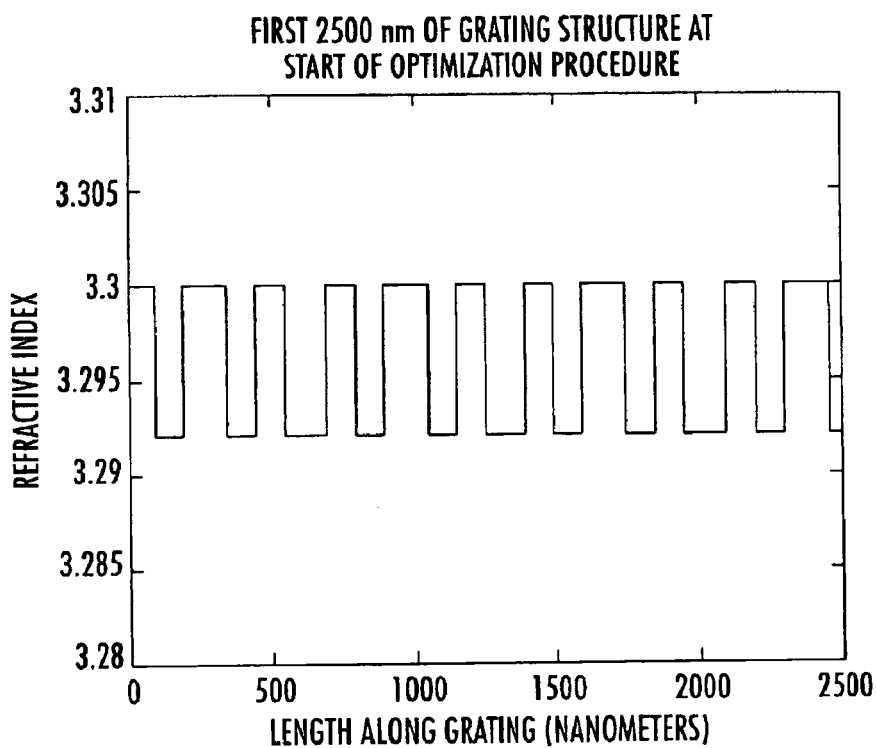
FIG. 3 shows an initial binary distribution of grating features during the optimization process according to FIG. 2.
Figure 4:
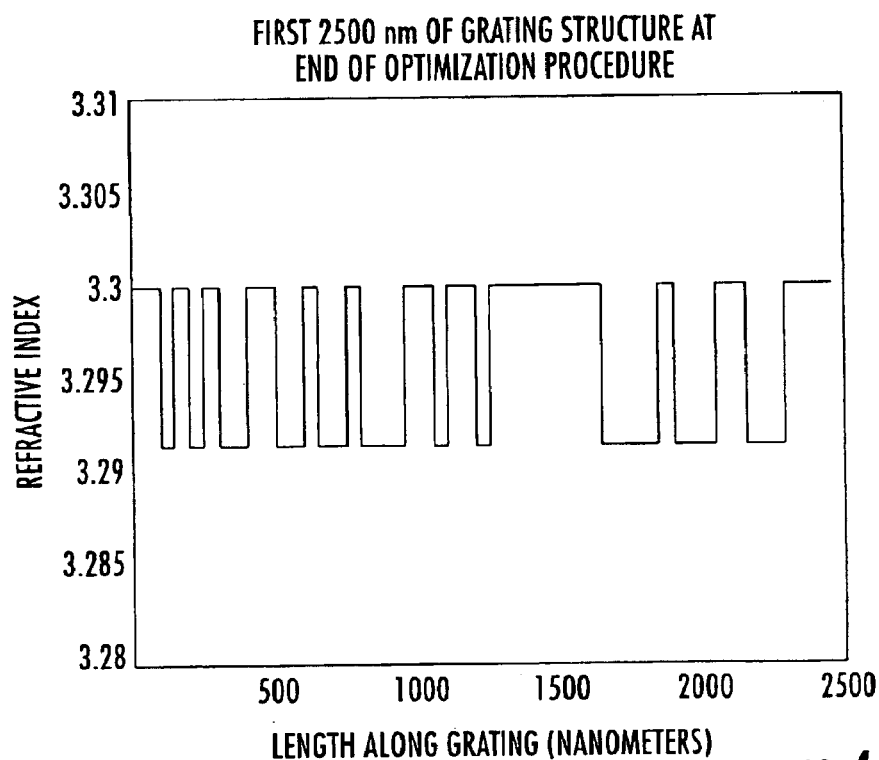
FIG. 4 shows a final binary distribution of grating features at the end of the optimization process according to FIG. 2.

FIG. 3 depicts the initial 2.5 μm length of a 50 μm long grating structure with an initial cost function, as defined above, of approximately $25*10^4$. The grating is non-periodic with a randomized pattern. FIG. 4 depicts the same initial 2.5 μm length of the grating after 200,000 iterations using the optimization process described above. The final grating structure has a cost function of 139.74.

Figure 5:
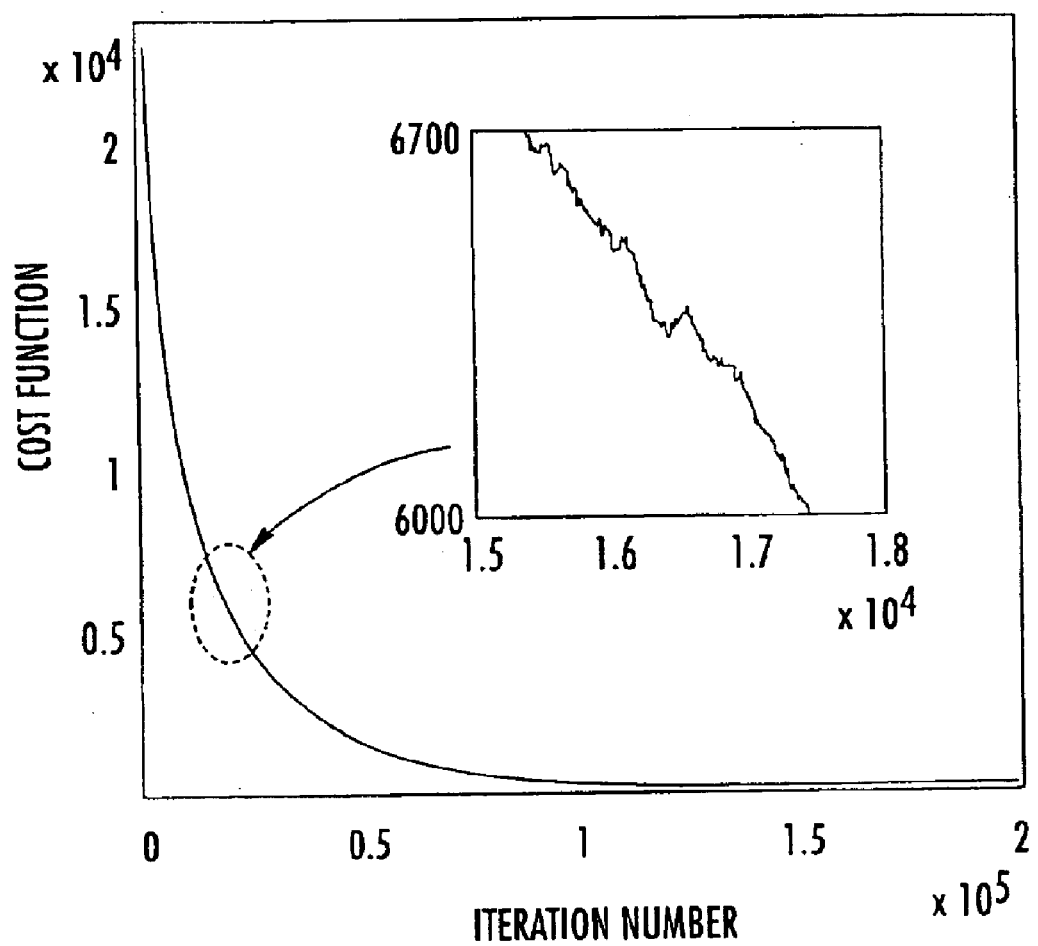
FIG. 5 shows the decrease of the cost function with the number of iterations using the optimization process according to FIG. 2.

FIG. 5 shows calculated values of the cost function as a function of the number of iterations. The insert in FIG. 5 depicts a detail of the curve, which shows a temporary increase in the cost function after approximately 16,500 iterations. When the cost function increases, the process 200 of FIG. 2 branches from step 220 to step 226, instead of going to step 222, as described above.

The results compare advantageously with those of Avrutsky et al. (U.S. Pat. No. 6,141,370). Avrutsky does not define a cost function as such, but rather a non-uniformity δ or residual factor as follows:

$$\delta = \langle (R_i - \langle R_i \rangle^2) \rangle^{1/2} / \langle R_i \rangle$$

where $R_i$ is the individual peak reflectance and $\langle \rangle$ operator denotes mean value.

For the purpose of comparing the curve fit obtained with the disclosed process with the results quoted in U.S. Pat. No. 6,141,370, the non-uniformity of the peaks of the simulated reflectance spectral response was calculated using the definition in U.S. Pat. No. 6,141,370, yielding a residual factor of $11.8503 \times 10^{-5}$, which is approximately 30 times smaller than the quoted value of $6 \times 10^{-4}$.

The process was repeated with different seed values, resulting in a comb filter peak residual factor for 10 successive runs of:

$4.3784 \cdot 10^{-5}$ $2.7646 \cdot 10^{-5}$ $3.0103 \cdot 10^{-5}$ $5.7097 \cdot 10^{-5}$ $2.6991 \cdot 10^{-5}$ $3.3177 \cdot 10^{-5}$ $2.22315 \cdot 10^{-5}$ $6.0982 \cdot 10^{-5}$ $44.0726 \cdot 10^{-5}$ $4.9748 \cdot 10^{-5}$ The computation speed between the scattering matrix method described in U.S. Pat. No. 6,141,370 was also compared with that of the FFT annealing process of FIG. 2. Both processes were executed on a Pentium® III desktop computer with 256MB RAM and running at a clock speed of 1 GHz. Computing the scattering matrix method takes approximately 3.5 min per iteration, whereas computing the FFT annealing process takes approximately 0.18 sec per iteration.

Figure 7:
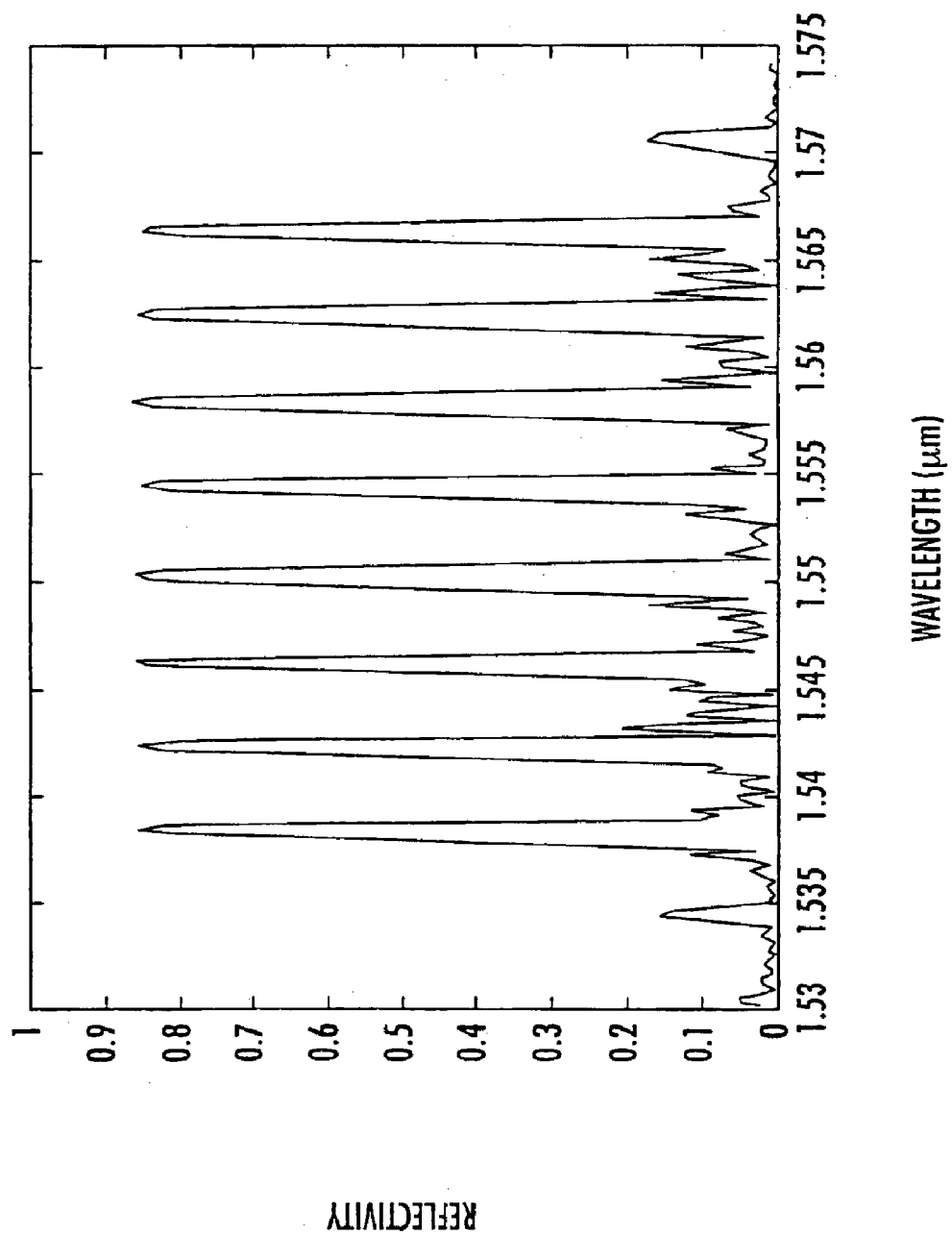
FIG. 7 shows schematically the spectral response of a comb filter designed with the process of FIG. 2 to have 8 spectral maxima of equal amplitude and equal wavelength spacing between 1.53 $\mu$m and 1.57 $\mu$m spectrum.
Figure 8:
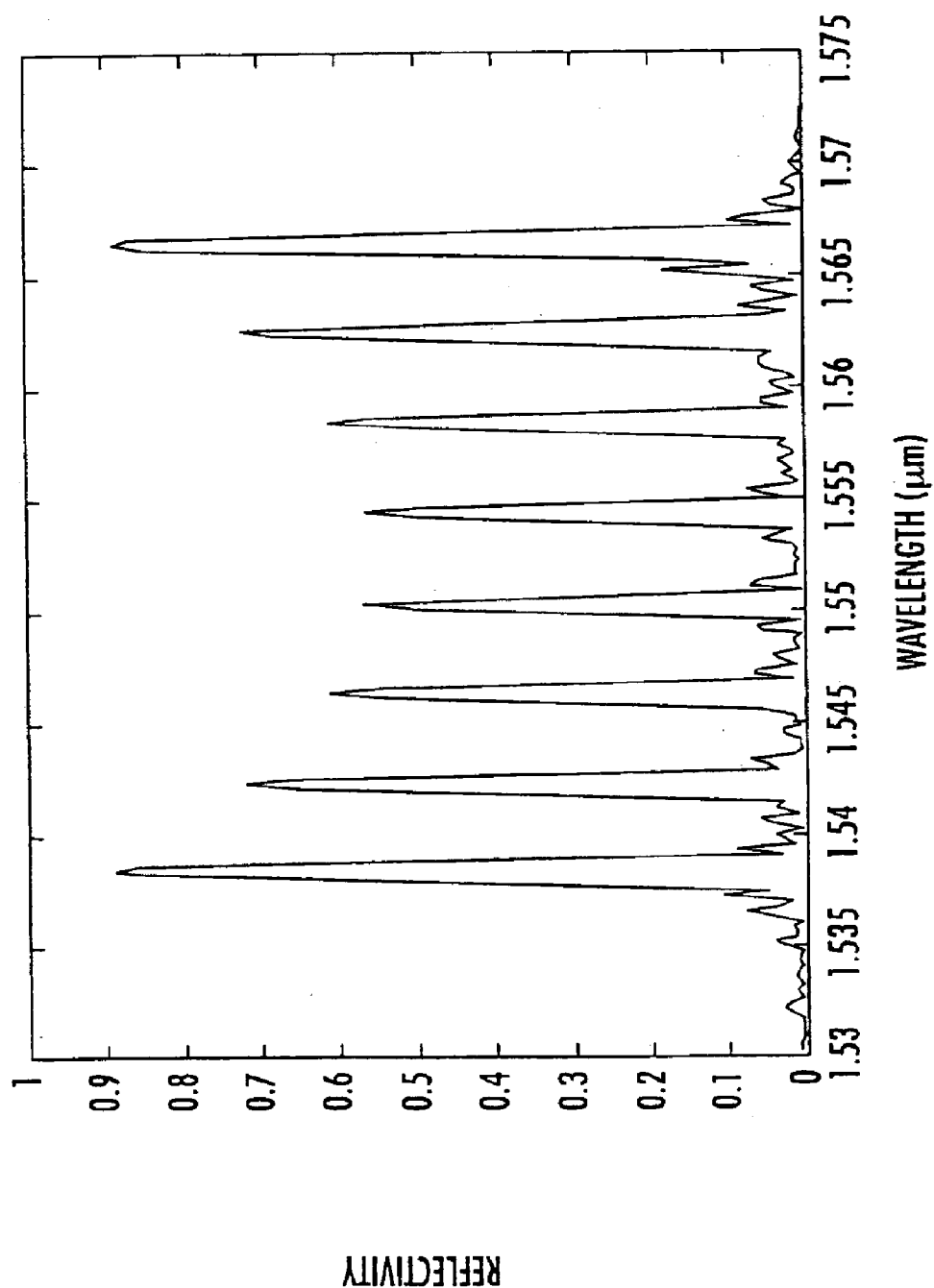
FIG. 8 shows schematically the spectral response of a comb filter designed with the process of FIG. 2 to have 8 spectral maxima of equal wavelength spacing between 1.538 $\mu$m and 1.567 $\mu$m and relative amplitudes conforming to an inverse parabolic envelope.
Figure 9:
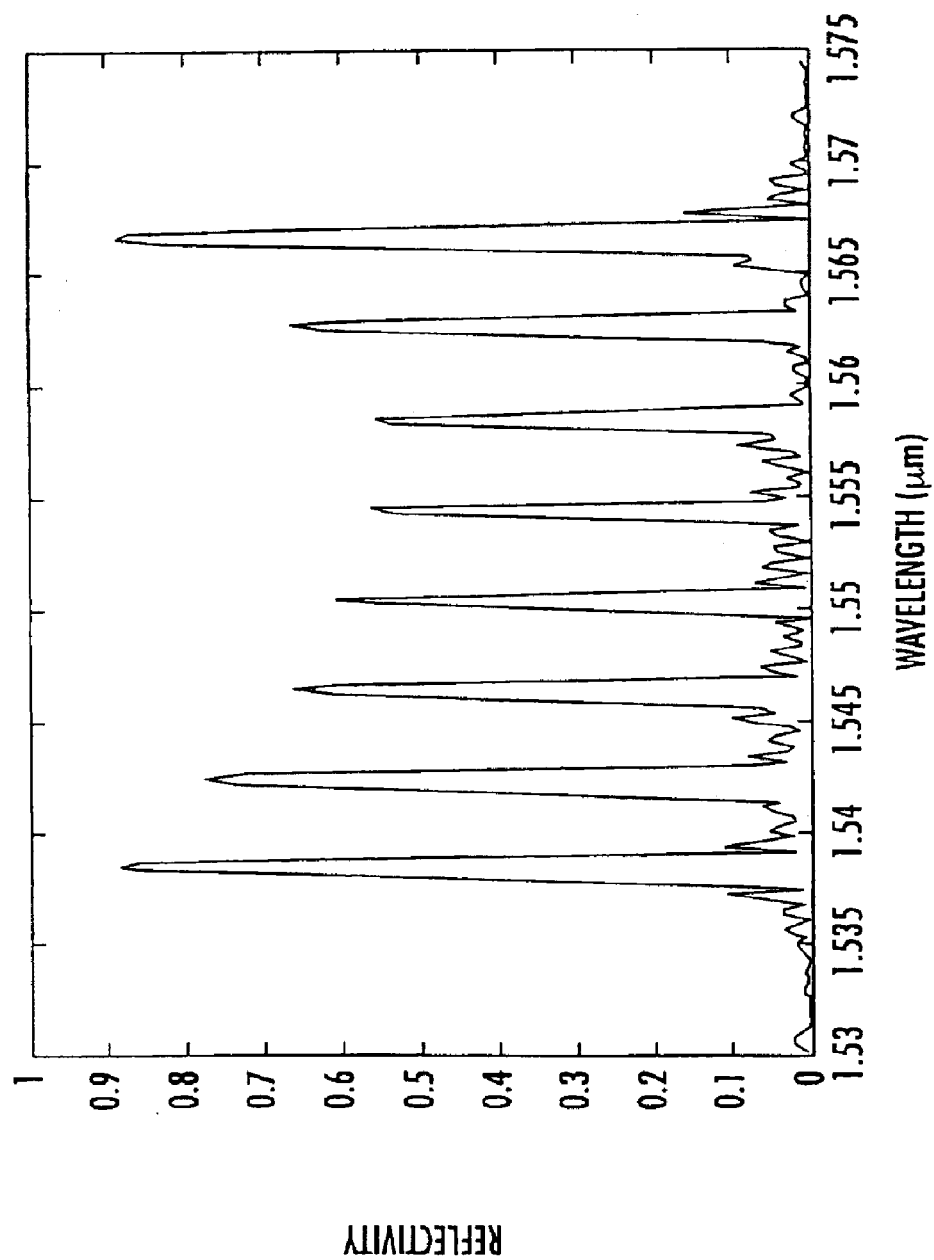
FIG. 9 shows schematically the spectral response of a comb filter designed with the process of FIG. 2 to have 8 spectral maxima of equal wavelength spacing between 1.538 $\mu$m and 1.567 $\mu$m and relative amplitudes conforming to a skewed inverse parabolic envelope.

FIG. 7 shows the spectral response of an aperiodic grating designed to have 8 uniformly spaced spectral maxima of uniform reflectivity in the wavelength range 1538–1567 nm. FIGS. 8 and 9 illustrate the flexibility of the process for providing a spectral response using the FFT annealing process. Spectral maxima with different predetermined amplitudes can be easily designed. For example, the aperiodic grating in FIG. 8 is designed to produce a spectral response with eight peaks in the wavelength range of 1538–1567 nm with an inverse parabolic amplitude envelope. Different envelopes can be designed to compensate, for example, for a particular gain profile of a laser or optical amplifier. The reflectivity curve of FIG. 8 converged in 200,000 iterations. The values for $T_{init}$, $\alpha$ and N were identical to those used for computing the grating response of FIG. 7. FIG. 9 depicts another spectral response designed to be skewed to shorter wavelengths, using the same parameters as for the computation of the response of FIG. 8. In both cases, the reflectivity of the lowest peaks are designed to be approximately 65% of the reflectivity of the highest outer peaks. The wavelength spacing between the spectral maxima can also be selected and need not be uniform.

An aperiodic grating structure, such as the structure of FIG. 1, can be disposed on waveguide structures made of materials that guide electromagnetic radiation and is not limited to optical waveguides. For example, aperiodic gratings can be designed for microwave waveguides. If aperiodic grating structures are incorporated in semiconductor waveguides, such grating structures can be fabricated using conventional semiconductor manufacturing processes, such as electron-beam lithography or photolithography, optionally in combination with a chemical or gas-assisted etch process. The gratings and/or filters can be employed as wavelength-selective elements in optical fibers and DBR/DFB lasers. The grating features can have, for example, a rectangular, sinusoidal, V-shaped and/or sawtooth profile, depending on the desired spectral response. A V-shaped grating profile can be approximated using, for example, more than two discrete values for the refractive index profile.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

That which is claimed is:

1. A method for creating an optical filter having aperiodically configured filter elements, comprising:
   selecting initial characteristic attributes for the filter elements based upon a random seed;
   generating an initial configuration of the filter elements having the initial characteristic attributes;
   defining a cost function representing a goodness of fit between a desired spectral response and a computed spectral response of the optical filter;
   using a simulated annealing process to iteratively compute the cost function by modifying at least one characteristic attribute of at least one filter element; and
   if the iteratively computed cost function is less than a predetermined cost function, selecting the configuration of the filter elements that corresponds to the iteratively computed cost function as a desired configuration of the filter elements to provide the desired spectral response.

2. The method of claim 1, wherein at least one of the characteristic attributes comprises a physical dimension of a respective filter element.

3. The method of claim 2, wherein the physical dimension comprises at least one of a width and a height of the respective filter element.

4. The method of claim 1, wherein at least one of the characteristic attributes comprises a refractive index of a respective filter element.

5. The method of claim 1, wherein at least one of the characteristic attributes comprises a spacing between adjacent filter elements.

6. The method of claim 1, wherein using a simulated annealing process comprises performing at least one Fourier transform of the characteristic attributes of the filter elements.

7. The method of claim 1, wherein the optical filter has a fixed length.

8. The method of claim 1, wherein a total number of the filter elements is fixed.

9. The method of claim 1, further comprising implementing the optical filter as a grating on an optical waveguide.

10. The method of claim 1, wherein the desired spectral response comprises transmission peaks located at wavelengths corresponding to an ITU grid.

11. The method of claim 1, wherein the desired spectral response is selected to compensate for a gain of a laser or amplifier.

12. A method for producing an optical waveguide with at least one desired optical transmission characteristic, comprising:
   selecting initial characteristic attributes for aperiodically configured grating elements based upon a random seed;
   generating an initial configuration of the grating elements having the initial characteristic attributes;
   defining a cost function representing a goodness of fit between a desired spectral response and a computed spectral response of the optical waveguide;
   using a simulated annealing process to iteratively compute the cost function by modifying at least one characteristic attribute of at least one grating element;
   if the iteratively computed cost function is less than a predetermined cost function, selecting the configuration of the grating elements that corresponds to the iteratively computed cost function as a desired configuration of the grating elements to provide the desired spectral response; and
   forming an aperiodic grating corresponding to the desired configuration of the grating elements in or on the optical waveguide so that the optical waveguide has the at least one desired optical transmission characteristic.

13. The method of claim 12, wherein at least one of the characteristic attributes comprises a physical dimension of a respective grating element.

14. The method of claim 13, wherein the physical dimension comprises at least one of a width and a height of the respective grating element.

15. The method of claim 12, wherein the optical waveguide comprises a semiconductor waveguide and wherein forming the aperiodic grating comprises forming the grating elements by a semiconductor process selected from the group consisting of electron beam lithography, photolithography, focused ion beam milling, chemical etching, and gas-assisted etching.

16. The method of claim 12, wherein at least one of the characteristic attributes comprises a refractive index of a respective grating element.

17. The method of claim 12, wherein at least one of the characteristic attributes comprises a spacing between adjacent grating elements.

18. The method of claim 12, wherein using a simulated annealing process comprises performing at least one Fourier transform of the characteristic attributes of the grating elements.

19. The method of claim 12, wherein the optical filter has a fixed length.

20. The method of claim 12, wherein a total number of the grating elements is fixed.

21. The method of claim 12, wherein the desired spectral response comprises transmission peaks located at wavelengths corresponding to an ITU grid.

22. The method of claim 12, wherein the desired spectral response is selected to compensate for a gain of a laser or amplifier.

* * * * *